United States Patent
Adetutu et al.

(10) Patent No.: US 6,933,227 B2
(45) Date of Patent: Aug. 23, 2005

(54) SEMICONDUCTOR DEVICE AND METHOD OF FORMING THE SAME

(75) Inventors: Olubunmi O. Adetutu, Austin, TX (US); Kevin D. Lucas, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/691,984

(22) Filed: Oct. 23, 2003

(65) Prior Publication Data

US 2005/0087870 A1 Apr. 28, 2005

(51) Int. Cl.⁷ .......................................... H01L 21/4763
(52) U.S. Cl. ....................................... 438/636; 438/785
(58) Field of Search ............................... 438/636, 785, 438/794

(56) References Cited

U.S. PATENT DOCUMENTS

| | | | |
|---|---|---|---|
| 5,918,147 A | | 6/1999 | Filipiak et al. |
| 6,232,209 B1 | * | 5/2001 | Fujiwara et al. ............ 438/585 |
| 6,541,397 B1 | | 4/2003 | Bencher |
| 6,589,858 B1 | * | 7/2003 | Dakshina-Murthy et al. ...................... 438/592 |
| 6,593,446 B1 | | 7/2003 | Jung et al. |
| 2003/0004283 A1 | | 1/2003 | Puligadda et al. |
| 2003/0049566 A1 | | 3/2003 | Sabnis et al. |
| 2003/0087188 A1 | | 5/2003 | Jung et al. |
| 2004/0043604 A1 | * | 3/2004 | Vaarstra ..................... 438/653 |

* cited by examiner

*Primary Examiner*—George Fourson
*Assistant Examiner*—Fernando L. Toledo
(74) *Attorney, Agent, or Firm*—Michael J. Balconi-Lamica; Joanna G. Chiu

(57) ABSTRACT

A process for forming a semiconductor structure includes forming a gate dielectric overlying a substrate, a conductive gate electrode overlying the gate dielectric, a barrier layer overlying and in physical contact with the conductive gate electrode, and an organic anti-reflective coating (ARC) layer overlying and in physical contact with the barrier layer.

23 Claims, 3 Drawing Sheets

US 6,933,227 B2

SEMICONDUCTOR DEVICE AND METHOD OF FORMING THE SAME

BACKGROUND

The present disclosures relate to semiconductor devices and semiconductor device manufacturing, and more particularly, to the use of a barrier layer overlying a conductive gate electrode in a semiconductor device.

RELATED ART

In semiconductor device fabrication, it is known to use a masking layer (e.g., a photoresist) for patterning various device features, including for example, a gate stack. The gate stack includes at least a gate dielectric and a gate electrode, forming an interface between the gate dielectric and the gate electrode. The interface and the material of the gate electrode define a work function (WF) of the device, and in combination with other fabrication parameters (e.g., transistor doping levels, etc.), establishes a threshold voltage for the semiconductor device. For manufacturability purposes, the reproducibility and repeatability of the semiconductor device threshold voltage is critical. However, certain necessary fabrication process steps interfere with maintaining a desired reproducibility and repeatability of the threshold voltage. Such interference is undesirable.

Accordingly, there is needed a structure and method for overcoming the problems in the art as discussed above.

SUMMARY

According to one embodiment, a process for forming a semiconductor structure includes forming a gate dielectric overlying a substrate, a conductive gate electrode overlying the gate dielectric, a barrier layer overlying and in physical contact with the conductive gate electrode, and an organic anti-reflective coating (ARC) layer overlying and in physical contact with the barrier layer.

BRIEF DESCRIPTION OF THE DRAWINGS

The embodiments of the present disclosure are illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve an understanding of the embodiments of the present disclosure.

DETAILED DESCRIPTION

Certain elements used during the semiconductor fabrication process have been discovered to diffuse along grain boundaries of a gate electrode material to an underlying gate electrode/gate dielectric interface. For example, in the particular case of semiconductor device fabrication using oxygen in the removal of a masking layer (e.g., photoresist) and an organic ARC, diffusion of oxygen along the grain boundaries contributes to a presence of extra oxygen at the gate electrode/gate dielectric interface, causing an undesirable and unpredictable shifting of the device threshold voltage. In addition, in the instance where the gate electrode includes a metal, the gate electrode could become oxidized. Oxidation of the gate electrode adversely affects the operation and performance of the semiconductor device.

Figure 1:
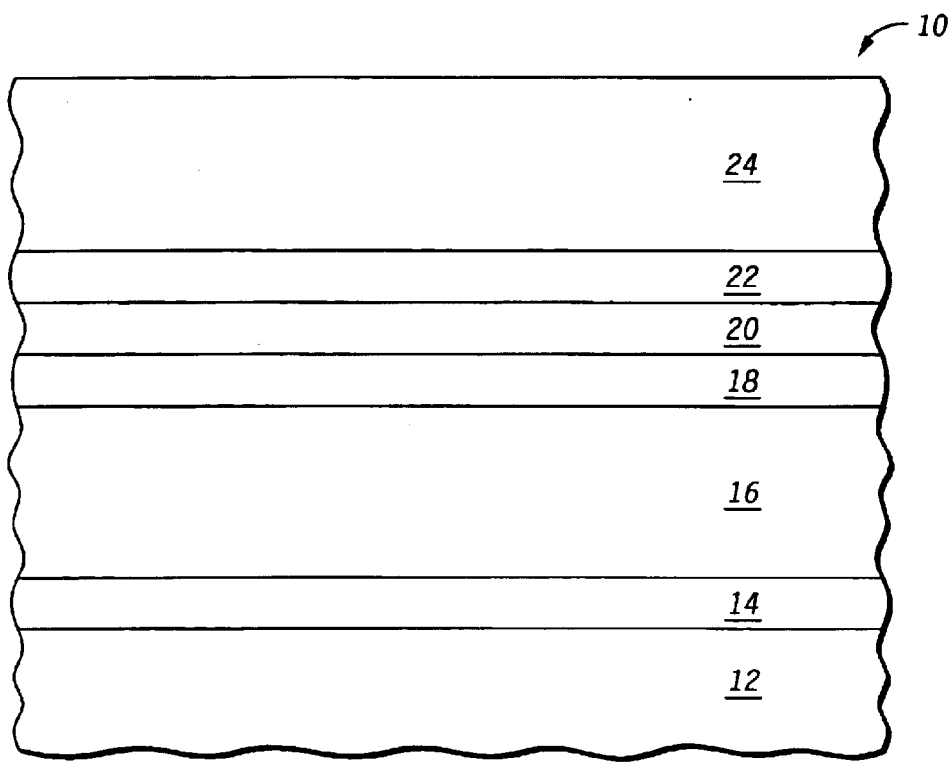
FIG. 1 is cross-sectional view of a portion of a semiconductor structure during fabrication thereof according to one embodiment of the present disclosure.

FIG. 1 is cross-sectional view of a portion of a semiconductor structure during fabrication thereof according to one embodiment of the present disclosure. In particular, a portion of a semiconductor structure 10 includes a substrate 12, gate dielectric layer 14, gate electrode layer 16, barrier layer 18, organic containing layer 20, an optional interaction inhibiting layer 22, and a photoresist layer 24. Substrate 12 can include a bulk silicon substrate, an SOI substrate (fully depleted or partially depleted), a SiGe substrate, or any other suitable semiconductor substrate. Gate dielectric layer 14 can include a silicon nitride, silicon oxy-nitride, silicon oxide, metal silicate, metal aluminate, metal oxide, or combination of any of the same.

Gate electrode layer 16 can include any suitable conductive metal(s), transition metal(s), nobel metal(s), metal nitride(s), metal silicide(s), metal alloy(s) and conductive metal oxide(s), or combinations thereof. Gate electrode layer 16 may also include a stack of more than one layer of such materials. For example, gate electrode layer 16 may include titanium, tantalum, tungsten, nickel, cobalt, molebnum, palladium, and nitrides and suicides thereof; iridium, ruthenium, platinum and oxides thereof; or other suitable conductive metal. In an alternate embodiment, the conductive gate electrode includes polysilicon.

Barrier layer 18 can include a non-conductive oxygen resistant barrier layer of a stoichometric silicon nitride ($Si_3N_4$), silicon rich silicon nitride, nitrogen rich silicon nitride, titanium nitride, or any suitable metal, metal nitride, or metal silicon nitride, ruthenium oxide, iridium oxide, platinum oxide, or any other suitable conductive oxide. One example of a conductive oxygen resistant layer includes TiN. The barrier layer 18 prevents oxygen penetration to an underlying layer or layers. The barrier layer can also be characterized as one of a conductive or non-conductive oxygen resistant layer and a conductive oxygen absorbing layer.

In one embodiment, the barrier layer 18 includes at least one of silicon and nitrogen. In the instance where the barrier layer includes silicon, the silicon acts as a self-limiting oxidation layer, i.e., the layer is characterized by self-limiting oxidation of the silicon. Further with respect to the barrier layer including silicon, the portion of the layer consumed by the self-limited oxidation of silicon can be subsequently removed. In addition, any remaining silicon can also be removed or left to remain in place for subsequent salicide processing. Subsequent removal of the $SiO_2$ or Si can be accomplished by a respective suitable wet or dry etch.

Alternatively, the barrier layer 18 can comprise a conductive oxygen absorbing layer of at least one metal selected from the group consisting of iridium, ruthenium, and platinum. The barrier layer 18 may also comprise an oxygen absorbing conductive oxide layer of ruthenium oxide, iridium oxide, and platinum oxide. Furthermore, in one embodiment, the barrier layer is in direct physical contact with the metal gate electrode layer, and the carbon-containing ARC layer is in direct physical contact with the barrier layer. Furthermore, barrier layer 18 has a thickness on the order of approximately 20 to 500 Angstroms.

Organic containing layer 20 can include an organic anti-reflective coating (ARC) layer. In one embodiment, the organic ARC layer comprises carbon, and more particularly, a carbon based organic ARC. The organic ARC can be spin-on or CVD. Optional interaction inhibiting layer 22 can include any suitable layer for inhibiting interaction between the photoresist layer and the organic containing layer. In one example, the interaction inhibiting layer inhibits interaction of the underlying layer with the photoresist to prevent photoresist poisoning. In one embodiment, layer 22 includes a silicon oxide layer ($SiO_2$) layer or SiON. Photoresist layer 24 can include any suitable photoresist, which also could be silicon containing.

Figure 2:
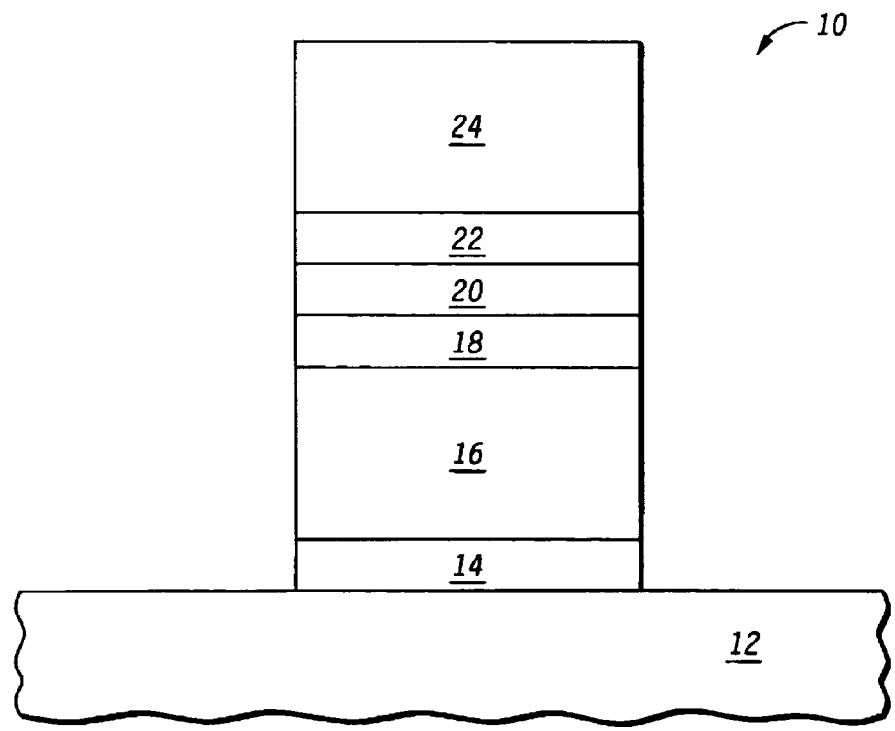
FIG. 2 is cross-sectional view of the portion of the semiconductor structure of FIG. 1 during further fabrication according to one embodiment of the present disclosure.

FIG. 2 is cross-sectional view of the portion of the semiconductor structure of FIG. 1 during further fabrication according to one embodiment of the present disclosure. More particularly, the stack of layers 14, 16, 18, 20, 22, and 24 are patterned according to the requirements of a particular semiconductor device to form an intermediate gate stack.

Figure 3:
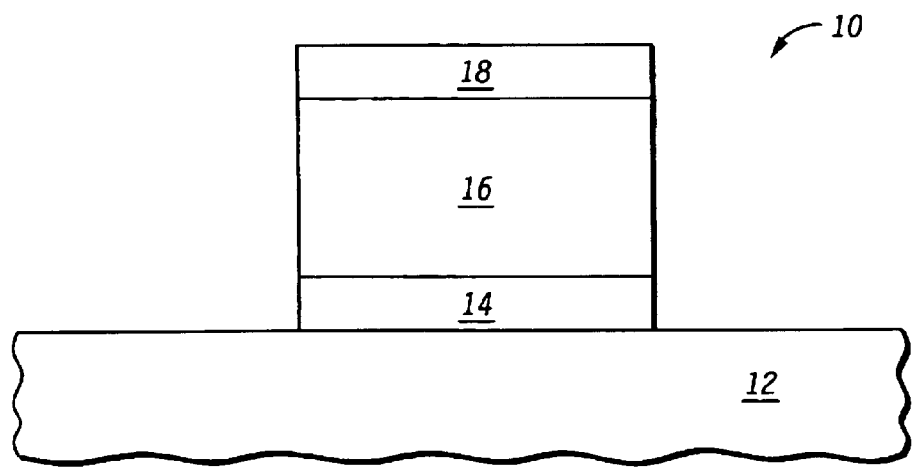
FIG. 3 is cross-sectional view of the portion of the semiconductor structure of FIG. 2 during further fabrication according to one embodiment of the present disclosure.

FIG. 3 is cross-sectional view of the portion of the semiconductor structure of FIG. 2 during further fabrication according to one embodiment of the present disclosure. In particular, subsequent to the patterning of the intermediate gate stack, the photoresist layer 24, interaction inhibiting layer 22 and organic containing layer 20 are removed using removal techniques known in the art. What remains is a gate stack comprising gate dielectric 14, gate electrode, and barrier layer 18. In an alternate embodiment, barrier layer 18 may also be removed.

Figure 4:
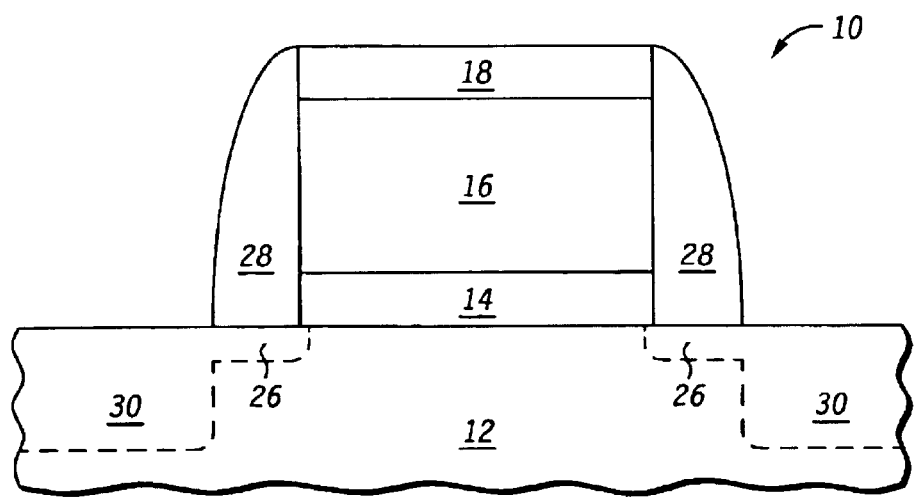
FIG. 4 is cross-sectional view of the portion of the semiconductor structure of FIG. 3 during further fabrication according to one embodiment of the present disclosure.

FIG. 4 is cross-sectional view of the portion of the semiconductor structure of FIG. 3 during further fabrication according to one embodiment of the present disclosure. In particular, implantations are conducted to form source/drain (S/D) extension regions 26 using techniques known in the art. Subsequent to formation of the S/D extension regions 26, sidewall spacers 28 are formed using techniques known in the art. Furthermore, subsequent to the formation of the sidewall spacers 28, source/drain implants and activations are performed for forming source/drain regions 30.

Figure 5:
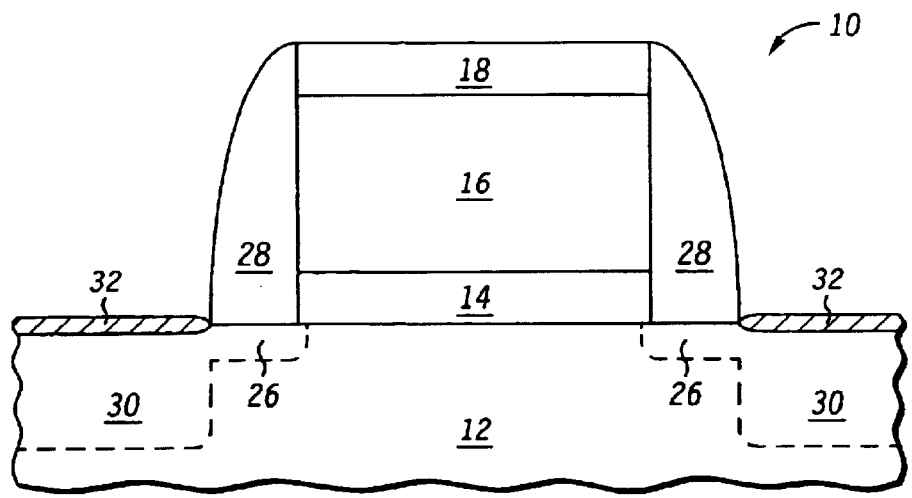
FIG. 5 is cross-sectional view of the portion of the semiconductor structure of FIG. 4 during further fabrication according to one embodiment of the present disclosure.

FIG. 5 is cross-sectional view of the portion of the semiconductor structure of FIG. 4 during further fabrication according to one embodiment of the present disclosure. More particularly, silicide contact regions 32 of the source/drain regions 30 are formed using a salicide process, known in the art. Accordingly, with the process as outlined herein above, the transistor properties of the resultant device are protected during the fabrication process. In one embodiment, it is the use of the oxygen diffusion barrier on top of the metal gate in combination with the use of the carbon based organic arc that provides the resultant semiconductor device transistor with protected transistor properties. For example, the gate electrode/gate dielectric interface is preserved and consequently, so is the work function of the gate electrode. The device work function relates to the threshold voltage of the device. Accordingly, fabrication of a semiconductor device with the methods of the present disclosure provides a more robust resultant semiconductor device having desired transistor properties.

Figure 6:
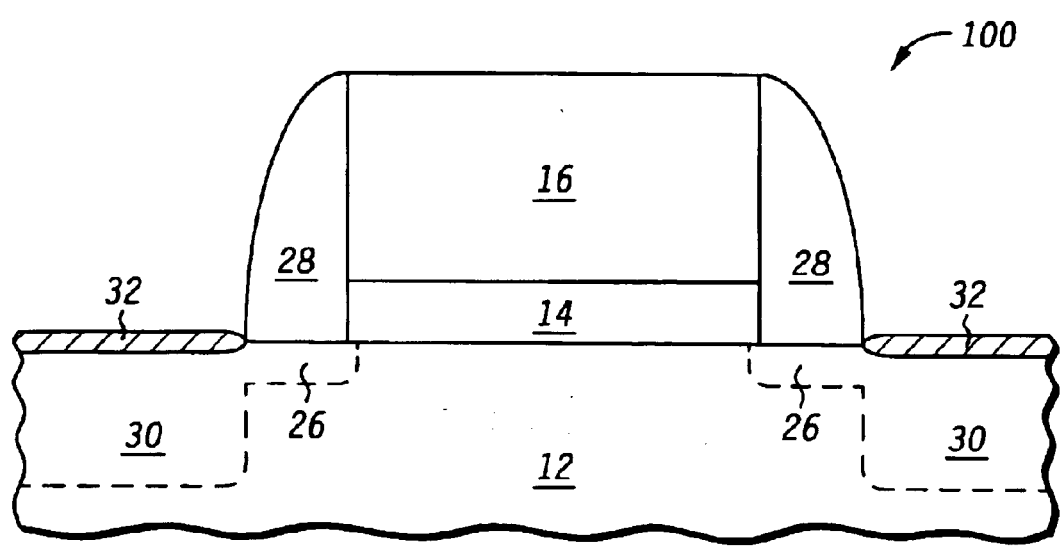
FIG. 6 is cross-sectional view of a portion of a semiconductor structure according to another embodiment of the present disclosure.

FIG. 6 is cross-sectional view of a portion of a semiconductor structure 100 according to another embodiment of the present disclosure. The embodiment of FIG. 6 is similar to the embodiment of FIG. 5, but without retaining barrier layer 18. In particular, beginning with the embodiment of FIG. 4, the same is further processed for removing the overlying barrier layer 18. Subsequent to the removal of layer 18, a salicide process is implemented to form silicide contact regions 32 of the source/drain regions 30. Accordingly, with the process as outlined herein above, the transistor properties of the resultant device are protected during the fabrication process. In one embodiment, it is the use of the oxygen diffusion barrier on top of the metal gate in combination with the use of the carbon based organic arc that provides the resultant semiconductor device transistor with protected transistor properties.

Accordingly, a process for forming a semiconductor structure includes forming a gate dielectric overlying a substrate, a conductive gate electrode overlying the gate dielectric, a barrier layer overlying and in physical contact with the conductive gate electrode, and an organic anti-reflective coating (ARC) layer overlying and in physical contact with the barrier layer. In one embodiment, forming includes forming a masking layer overlying the organic ARC layer. The process further includes removing the masking layer and the organic ARC layer. In an alternate embodiment, the process includes forming an oxygen-containing layer between the organic ARC layer and the masking layer. In the alternate embodiment, removing includes removing the masking layer, the oxygen-containing layer, and the organic ARC layer. Still further, the process can include removing the barrier layer.

In another embodiment, a process for forming a semiconductor structure includes: forming a gate dielectric layer overlying a substrate; forming a metal gate electrode layer overlying the gate dielectric layer; forming a barrier layer overlying the metal gate electrode layer; forming a carbon-containing ARC layer overlying the barrier layer; forming a patterned masking layer overlying the carbon-containing ARC layer; and removing portions of the gate dielectric layer, the metal gate electrode layer, the barrier layer, and the carbon-containing ARC layer using the patterned masking layer to form an intermediate gate stack.

The process can further include removing the masking layer and the carbon-containing ARC layer from the intermediate gate stack to form a gate stack. Removing the masking layer and the carbon-containing ARC layer can be performed in an oxygen and plasma environment. During removal of the masking layer and the carbon-containing ARC layer in the oxygen and plasma environment, the barrier layer retards oxygen from diffusing into the metal gate electrode layer of the intermediate gate stack.

The process can still further include forming spacers adjacent to each sidewall of the gate stack and forming source and drain regions in the substrate, underlying at least a portion of the spacers and the gate stack. The process may still further include removing the barrier layer from the gate stack and saliciding the source and drain regions. Removing the barrier layer may be performed before or after siliciding the source and drain regions.

The process can yet further include forming an oxygen-containing layer overlying the carbon-containing ARC layer, wherein the pattern masking layer is formed overlying the oxygen-containing layer, and wherein removing further comprises removing portions of the oxygen-containing layer to form the intermediate gate stack.

According to still yet another embodiment, a semiconductor structure includes a gate dielectric overlying a substrate; a metal gate electrode overlying the gate dielectric; and an oxygen diffusion barrier layer overlying and in physical contact with the conductive gate electrode. The oxygen diffusion barrier layer includes at least one of silicon and nitrogen. Alternatively, the oxygen diffusion barrier layer includes a metal selected from a group consisting of ruthenium, iridium, and platinum. In addition, the oxygen diffusion barrier layer can include amorphous silicon.

In the foregoing specification, the disclosure has been described with reference to various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements by may include other elements not expressly listed or inherent to such process, method, article, or apparatus.

What is claimed is:

1. A process for forming a semiconductor structure comprising: forming a gate dielectric overlying a substrate, a conductive gate electrode overlying the gate dielectric, a barrier layer overlying and in physical contact with the conductive gate electrode, and an organic anti-reflective coating (ARC) layer overlying and in physical contact with the barrier layer, wherein forming comprises forming a masking layer overlying the organic ARC layer, further comprising removing the masking layer and the organic ARC layer, wherein forming further comprises forming an oxygen-containing layer between the organic ARC layer and the masking layer, and wherein removing further comprises removing the masking layer, the oxygen-containing layer, and the organic ARC layer.

2. The process of claim 1, further comprising removing the barrier layer.

3. The process of claim 1, wherein the conductive gate electrode comprises a metal.

4. The process of claim 1, wherein the conductive gate electrode comprises polysilicon.

5. The process of claim 1, wherein the barrier layer has a thickness in a range of approximately 20 Angstroms to 500 Angstroms.

6. The process of claim 1, wherein the organic ARC layer comprises carbon.

7. The process of claim 3, wherein the barrier layer is further characterized as an oxygen resistant barrier layer.

8. The process of claim 3, wherein the barrier layer comprises at least one of silicon and nitrogen.

9. The process of claim 3, wherein the barrier layer comprises a metal whose oxides are conductive.

10. The process of claim 3, wherein the barrier layer comprises amorphous silicon.

11. The process of claim 8, wherein the barrier layer comprises silicon and nitrogen.

12. A process for forming a semiconductor structure comprising: forming a gate dielectric overlying a substrate, a conductive gate electrode overlying the gate dielectric, a barrier layer overlying and in physical contact with the conductive gate electrode, and an organic anti-reflective coating (ARC) layer overlying and in physical contact with the barrier layer, wherein the conductive gate electrode comprises a metal and wherein the barrier layer comprises a metal selected from a group consisting of iridium, ruthenium, and platinum.

13. A process for forming a semiconductor structure, comprising: forming a gate dielectric layer overlying a substrate; forming a metal gate electrode layer overlying the gate dielectric layer; forming a barrier layer overlying the metal gate electrode layer; forming a carbon-containing ARC layer overlying the barrier layer; forming a patterned masking layer overlying the carbon-containing ARC layer; removing portions of the gate dielectric layer, the metal gate electrode layer, the barrier layer, and the carbon-containing ARC layer using the patterned masking layer to form an intermediate gate stack; and removing the masking layer and the carbon-containing ARC layer from the intermediate gate stack to form a gate stack, wherein removing the masking layer and the carbon-containing ARC layer is performed in an oxygen and plasma environment.

14. The process of claim 13, wherein during removal of the masking layer and the carbon-containing ARC layer in the oxygen and plasma environment, the barrier layer retards oxygen from diffusing into the metal gate electrode layer of the intermediate gate stack.

15. The process of claim 13, further comprising: forming spacers adjacent to each sidewall of the gate stack; and forming source and drain regions in the substrate, underlying at least a potion of the spacers and the gate stack.

16. The process of claim 15, further comprising: removing the barrier layer from the gate stack; and saliciding the source and drain regions.

17. The process of claim 16, wherein removing the barrier layer is performed after saliciding the source and drain regions.

18. The process of claim 13, wherein the barrier layer is characterized as one of an oxygen resistant and an oxygen absorbing layer.

19. The process of claim 13, wherein the barrier layer comprises at least one of silicon and nitrogen.

20. The process of claim 13, wherein the barrier layer comprises at least one selected from the group consisting of a non-conductive oxygen resistant layer, a conductive oxygen resistant layer, and a conductive oxygen-absorbing layer.

21. The process of claim 13, wherein the barrier layer is in direct physical contact with the metal gate electrode layer, and the carbon-containing ARC layer is in direct physical contact with the barrier layer.

22. The process of claim 21, wherein the barrier layer has a thickness in a range of approximately 20 Angstroms to 500 Angstroms.

23. The processing of claim 13, further comprising forming an oxygen-containing layer overlying the carbon-containing ARC layer, wherein the pattern masking layer is formed overlying the oxygen-containing layer, and wherein removing further comprises removing portions of the oxygen-containing layer to form the intermediate gate stack.

* * * * *